(12) United States Patent
Ochotta et al.

(10) Patent No.: US 7,490,312 B1
(45) Date of Patent: Feb. 10, 2009

(54) PARTITION-BASED INCREMENTAL IMPLEMENTATION FLOW FOR USE WITH A PROGRAMMABLE LOGIC DEVICE

(75) Inventors: Emil S. Ochotta, Mountain View, CA (US); William W. Stiehl, Lafayette, CO (US); Eric Shiflet, Boulder, CO (US); W. Story Leavesley, III, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 175 days.

(21) Appl. No.: 11/501,156

(22) Filed: Aug. 8, 2006

(51) Int. Cl.
*G06F 17/50* (2006.01)
(52) U.S. Cl. .................. 716/16; 716/2; 716/3; 716/11; 716/12
(58) Field of Classification Search .............. 716/16, 716/2, 3, 11, 12
See application file for complete search history.

(56) References Cited

U.S. PATENT DOCUMENTS

| 5,436,849 | A | 7/1995 | Drumm |
| 5,805,861 | A | 9/1998 | Gilbert et al. |
| 6,102,964 | A | 8/2000 | Tse et al. |
| 6,298,319 | B1 | 10/2001 | Heile et al. |
| 6,490,717 | B1 * | 12/2002 | Pedersen et al. ............... 716/18 |
| 6,871,336 | B1 * | 3/2005 | Anderson ....................... 716/9 |
| 7,086,029 | B1 | 8/2006 | Barras et al. |
| 7,134,112 | B1 * | 11/2006 | Anderson et al. ............. 716/13 |
| 2002/0162077 | A1 | 10/2002 | Jeng et al. |
| 2004/0128626 | A1 | 7/2004 | Wingren et al. |
| 2005/0172251 | A1 | 8/2005 | Chang et al. |
| 2005/0240892 | A1 | 10/2005 | Broberg et al. |

OTHER PUBLICATIONS

Xilinx, Inc, Development System Reference Guide:, 2005, Ch. 3, Incremental Design, pp. 55-74.*
U.S. Appl. No. 11/500,525, filed Aug. 8, 2006, Bell II et al.

* cited by examiner

*Primary Examiner*—Thuan Do
*Assistant Examiner*—Magid Y Dimyan
(74) *Attorney, Agent, or Firm*—Kevin T. Cuenot

(57) ABSTRACT

A method of incremental flow for a programmable logic device can include identifying elements of a hardware description language representation of a circuit design and specifying a hierarchy of partitions for selected ones of the elements. Portions of implementation data from a prior implementation flow for the circuit design can be associated with corresponding partitions. Selected portions of the implementation data from the prior implementation flow for at least one partition can be re-used during an incremental flow of the circuit design.

16 Claims, 3 Drawing Sheets

PARTITION-BASED INCREMENTAL IMPLEMENTATION FLOW FOR USE WITH A PROGRAMMABLE LOGIC DEVICE

BACKGROUND

1. Field of the Invention

The present invention relates to the field of circuit design and, more particularly, to incremental implementation flow for programmable logic devices.

2. Description of the Related Art

Incremental Implementation Flow (incremental flow) refers to a methodology for processing circuit designs in a manner that attempts to reuse prior implementation results for unchanging portions of the design. Incremental flow typically is used when an incremental change is made to a circuit design intended for use on a target programmable logic device (PLD), such as a field programmable gate array (FPGA). In general, an incremental change can be one that affects one or more portions of the circuit design. Typically, an incremental change neither significantly alters the size of the circuit design nor adversely affects the timing of the circuit design as a whole. Still, an incremental change can be more substantive in that timing may be adversely affected. Examples of incremental design changes can include, but are not limited to, changes to state machines, control logic, or the addition of registers intended to improve performance of the circuit design.

Incremental flow provides several benefits, making it a useful and desirable circuit design technique. One such benefit is that achieving verified results can be accomplished more rapidly. Results from a prior implementation flow likely have undergone significant testing and/or verification. In depth analysis of this sort is critical to ensuring a reliable circuit design. Repeating such analysis each time the circuit design undergoes a minor, or incremental, change can be cumbersome and time consuming, particularly since significant portions of the circuit design remain unchanged. Re-use of previously tested portions of the circuit design can reduce the time needed to arrive at a verified design solution.

Another benefit is that incremental flow supports a "divide and conquer" approach to circuit design. Creating a circuit design that conforms to an established design goal, for example in terms of timing requirements, power consumption, and the like, can be exceedingly difficult and time consuming. In such cases, it is useful to "lock" one or more particularly complex or troublesome portions of the circuit design to prevent further changes to those portions as other sections of the circuit design continue to evolve. The designer can direct his or her attention to the unfinished, evolving portions of the circuit design.

One technique for performing incremental flow is referred to as the guide technique. The guide technique utilizes results from a prior implementation flow, in reference to synthesis, translation, mapping, packing, placing, and routing, for the circuit design. These results, referred to as guide files, can be the output files from one or more phases of a prior implementation pass for the circuit design. The guide files are used during incremental flow to guide implementation of unchanged portions of the circuit design.

More particularly, the guide technique performs correlation among the thousands of leaf blocks in the implementation hierarchy. The leaves of the implementation hierarchy correspond to the logical elements that will be programmed onto the look-up-tables, flip-flops, and other circuit functions on the target FPGA. The hierarchy is created by circuit design implementation tools to enable efficient processing. For example, certain user constraints become levels of hierarchy.

Because synthesis, mapping, and packing are very sensitive to source code changes, the resulting leaf blocks may differ significantly for even a small change to the hardware description language (HDL), or source code, description of the circuit design. For example, a small source code change may overfill a particular look-up table, thereby producing a change that permeates throughout the circuit design. In that case, leaf-level correlation would be unable to match any of the affected blocks. Once correlation has been performed, the guide technique uses the existing infrastructure of the electronic design automation tool for handling circuit design constraints to instruct the tools to reuse the matched logic. Processing and evaluation of constraints can be very time-consuming. As a result, the guide technique often is slower than the initial implementation run.

One disadvantage of conventional incremental flow techniques, however, is that such techniques do not leverage hierarchy. Hierarchy refers to the ordered, or ranked, arrangement of modules of a circuit design that naturally occurs in most HDLs. The lack of support for hierarchy often makes incremental flow more complex. In illustration, conventional incremental flows do not allow the user to specify whether the implementation(s) of any set of module instances at any level of the design hierarchy should be reused. Conventional flows preclude the designer from specifying that modules in the same hierarchy should be reused. In consequence, the designer has little control over the granularity of reuse of portions of the circuit design, since reuse occurs only for the module instances directly under the root module of the circuit design.

Another disadvantage of conventional incremental flow techniques is that a designer must control each phase of the incremental flow, i.e. synthesis, translation, mapping, packing, placement, and routing, separately. For example, if a given module of the HDL representation of the circuit design is to be incrementally synthesized, a directive must be provided to the synthesis tool specifying the particular module to be incrementally synthesized. The circuit designer then must provide a similar directive to the translation tool, then to the mapping tool, etc., on through each phase of implementation.

Still another disadvantage is that re-use of a particular portion of a circuit design, i.e. a particular source module, still requires physically floorplanning the module. Floorplanning is a complex task that requires considerable skill on the part of the circuit designer to achieve high quality results. Without such skill, a degraded circuit design often results. Additionally, because floorplanning is performed a priori, a significant amount of time is required before a determination can be made as to whether incremental flow is even desired.

It would be beneficial to provide a technique that facilitates incremental flow which overcomes the limitations described above.

SUMMARY

The present invention provides methods and articles of manufacture relating to incremental implementation flow (incremental flow) of a circuit design for a programmable logic device (PLD). One embodiment of the present invention can include a method of implementation flow for a PLD. The method can include identifying elements of a hardware description language (HDL) representation of a circuit design and specifying a hierarchy of partitions including selected ones of the elements. Portions of implementation data from a prior implementation flow for the circuit design can be associated with corresponding partitions. Selected portions of implementation data from the prior implementation flow for one or more partitions can be re-used during an incremental flow of the circuit design.

The method can include performing a plurality of phases of the incremental flow responsive to a unified instruction. One partition can be defined as a child and one partition can be defined as a parent of the child. One or more implementation options can be assigned automatically to a partition according to inheritance. An implementation option of the parent, for example, can be assigned automatically to the child. In addition, each instance of one of the selected elements of the circuit design can be specified as a different partition. The circuit design, or any portions thereof, need not be floorplanned to perform an incremental flow of the circuit design.

Another embodiment of the present invention can include a method of implementation flow for a PLD including identifying modules of an HDL representation of a circuit design and defining a partition corresponding to one or more modules. Partitions also can be specified on a per module instance basis with respect to the HDL representation, i.e. such that a partition includes one or more module instances. The method can include associating implementation data from a prior implementation flow of the circuit design with the partition according to at least one module included within the partition and using the implementation data associated with the partition during at least one phase of incremental flow for the circuit design without first floorplanning the circuit design.

The method can include copying the implementation data associated with the partition for use during the phase of incremental flow for the circuit design. One or more implementation options can be associated with the partition. The method also can include defining at least a second module of the circuit design as a second partition and specifying a parent-child relationship between the partition and the second partition. The second partition, for example, can be the parent and the partition can be the child. Accordingly, the method can include automatically assigning at least one implementation option of the parent to the child through inheritance. One or more implementation options originally specified through inheritance also can be overridden.

Yet another embodiment of the present invention can include a machine readable storage, having stored thereon a computer program having a plurality of code sections for causing a machine to perform the various steps and/or functions disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention provides a technique that facilitates incremental implementation flow (incremental flow) for a circuit design. In general, incremental flow refers to a methodology for processing designs in a manner that attempts to reuse prior implementation results for unchanging portions of a circuit design that is to be implemented on a programmable logic device (PLD). In accordance with the embodiments described herein, portions of a circuit design can be marked as partitions. Implementation data from a prior implementation flow can be associated with corresponding partitions. When the circuit design is re-implemented subsequent to a change in the design, i.e. an incremental flow is performed, implementation data corresponding to unchanged partitions of the circuit design can be re-used.

In general, a partition refers to a portion of a circuit design that is defined by a user or circuit designer. Each partition is a group or collection of one or more circuit elements. Partitions support hierarchical relationships commonly used within a hardware description language (HDL) representation of a circuit design. Because implementation data for selected partitions is re-used, floorplanning of the circuit design prior to performing incremental flow is not required. In other words, because implementation data from a previous implementation database is grafted directly into the implementation database for incremental flow, floorplanning is not strictly required. The embodiments disclosed herein can reduce the portion of the circuit design that must be re-implemented from one incremental flow to the next as well as significantly reduce the time and complexity typically associated with performing incremental flow of a circuit design.

Figure 1:
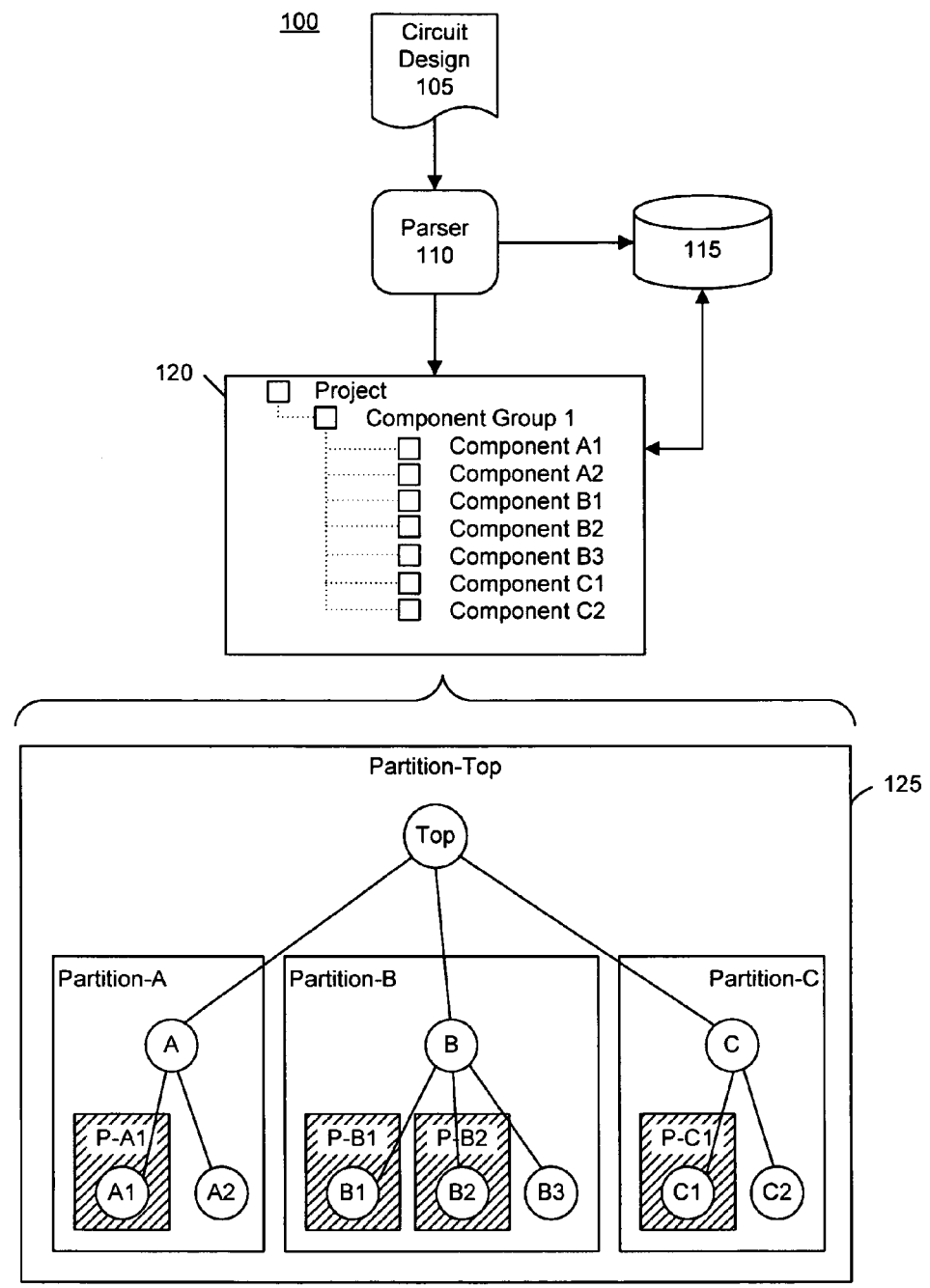
FIG. 1 is a block diagram illustrating a system for specifying partitions for a circuit design in accordance with one embodiment of the present invention.

FIG. 1 is a block diagram illustrating a system 100 for specifying partitions for a circuit design in accordance with one embodiment of the present invention. System 100 can include a parser 110, a data store 115, and a view 120 for use with a graphical user interface (GUI). In one embodiment, system 100 can be implemented as part of a software-based electronic design automation system or suite of tools. For example, system 100 can be implemented as the Xilinx® Integrated Software Environment (ISE), which is available from Xilinx®, Inc. of San Jose, Calif. Xilinx® ISE provides the software tools necessary for a developer to process an HDL representation of a circuit design through the various stages of implementation up to device programming.

Parser 110 can process an HDL representation of a circuit design (circuit design) 105. In one embodiment, parser 110 can be implemented as, or similar to, a parser typically included within a synthesis tool, for example Xilinx® Synthesis Technology (XST). As known, synthesis is the process of converting behavioral HDL into a network of logic gates. A synthesis tool can process the HDL circuit design using a library of primitives, which can include logic gates as well as more complex primitives such as shift registers, arithmetic units, and the like.

Accordingly, parser 110 can evaluate circuit design 105 and identify the various modules and corresponding primitives defined therein as well as the individual instantiations of modules. Further information including, but not limited to, the hierarchical relationships among modules and module instantiations as well as connectivity can be determined. This information can be inferred by the parser 110 from circuit design 105 and produced as output data. As shown, the output data can be stored within data store 115. In one embodiment, the information can be organized in a database, such as a relational database, though the present invention is not limited to use of such a data structure.

The data generated and stored within data store 115 can be presented to the user via view 120 which can be presented as, or as part of, a GUI. View 120 visually presents images, symbols, and/or text representing the various primitives of circuit design 105 to the user. Though shown in a hierarchical arrangement, the various circuit elements can be presented in any of a variety of different views and arrangements. In any case, view 120 provides a mechanism through which a circuit designer can specify partitions for circuit design 105.

View 120 allows a circuit designer to specify partitions for circuit design 105 on any of a variety of different hierarchical levels, including on a per module instance basis. In illustration, Component Group 1 in view 120 includes several modules which are represented as components. More particularly, Component Group 1 includes two instances of component A, shown as component A1 and A2, three instances of component B, shown as component B1, B2, and B3, as well as two instances of component C, shown as component C1 and C2. Through view 120, a partition can be defined by a circuit designer that corresponds to instance A1 and/or A2 of component A, instance B1, B2, or B3 of component B, instance C1 or C2 of component C, or any combination thereof. Similarly, a partition can be defined on a higher level, for example one that corresponds to Component Group 1 or an even higher level in the design hierarchy, should one exist.

For example, in one embodiment, the designer can select one or more components and issue a partition command. Such a command can be available via a drop down menu, via a pop-up style menu responsive to a right click of a pointing device, through a command line interface such as Tool Command Language (Tcl), etc. Regardless, a GUI can be presented through which the designer can specify various attributes relating to the partition being defined.

View 125 illustrates the hierarchical nature in which partitions can be specified for circuit design 105. In one embodiment, view 125 can be presented as, or as part of, a GUI. As shown in view 125, a partition called Partition-Top has been created that corresponds to the "top" node, i.e. Component Group 1. Partition-A has been created to encompass component A and all instances of component A. Partition-B has been created to encompass component B and all instances of component B. Similarly, Partition-C has been created to encompass component C and all instances of component C.

Within Partition-A, a partition called P-A1 has been created to encompass only instance A1 of component A. Instance level partitions have been defined with respect to Partition-B and Partition-C also. The hierarchal nature of partitions can be observed in that partition P-A1 is a child of Partition-A. Accordingly, Partition-A is a parent of partition P-A1. Similarly, Partition-A is a child of Partition-Top, which is the parent to Partition-A.

Each of the partitions can be associated with one or more implementation options. An implementation option is a parameter that influences how the partition is to be processed or handled during incremental flow. One example of an implementation option is "effort-level". An effort level indicates the amount of effort that is to be expended by the design tool to accomplish a particular task, such as synthesis, place and route, etc. For instance, effort level controls the amount of time needed to accomplish a task and possibly the quality of the result by selecting a more or less CPU-intensive algorithm. It should be appreciated that effort level is but one type of implementation option and that many other implementation options can be specified for each phase of the implementation flow. For example, other implementation options can include, but are not limited to, retiming during synthesis, enable packing of unrelated logic, register duplication, remove disabled logic, optimize for area vs. performance, and the like.

Within the hierarchy of partitions, implementation options can be inherited by child partitions from parents. In illustration, through inheritance, if a parent partition has an effort level set to "high" for place and route, the child partition can inherit that effort level for place and route. Still, the circuit designer can override any implementation option assigned through inheritance if so desired. Such changes can be effected via views 120 and/or 125 as well as through a command line interface as discussed.

In addition to implementation options, other information such as implementation data also can be associated with a partition. For example, implementation data pertaining to partition P-A1, and thus instance A1, from one or more phases, i.e. synthesis, translation, mapping, packing, placement, and routing, of an implementation flow can be associated with the partition for potential re-use in a subsequent incremental flow. Information such as implementation options and implementation data can be stored in data store 115. As noted, such information can be stored using a relational database or other suitable data structure.

Figure 2:
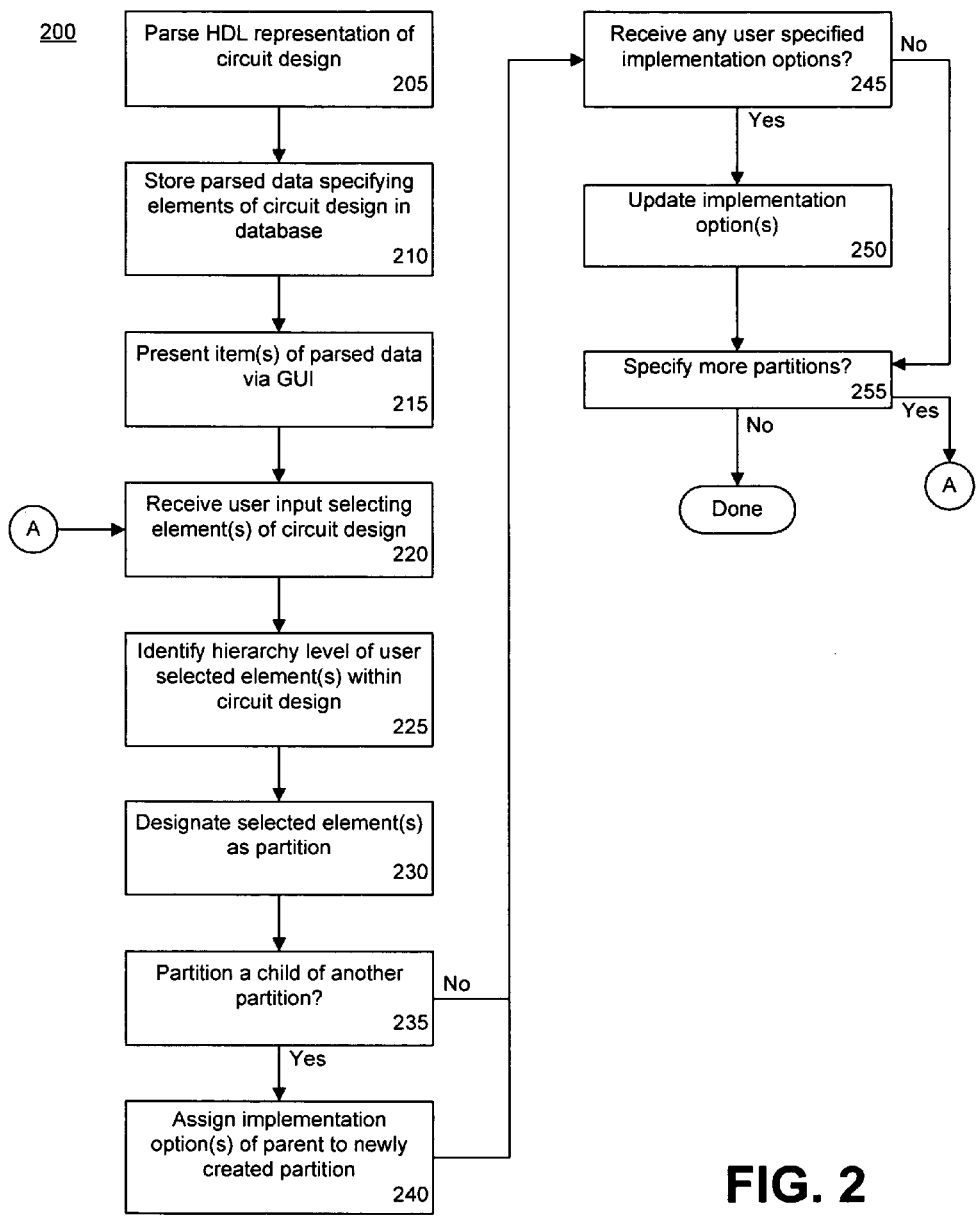
FIG. 2 is a flow chart illustrating a method of specifying partitions in a circuit design in accordance with another embodiment of the present invention.

FIG. 2 is a flow chart illustrating a method 200 of specifying partitions in a circuit design in accordance with another embodiment of the present invention. Method 200 can be performed using a system such as the one described with reference to FIG. 1. In step 205, an HDL representation of a circuit design can be parsed or processed. In step 210, the parsed data, i.e. data specifying the various primitives of the circuit design, instantiations of primitives, connectivity, and the relationships among the various primitives, can be stored in a database.

In step 215, one or more portions of the parsed data stored within the database can be presented to a user through a view of a GUI, for example of an EDA tool. In step 220, a user input specifying a particular element of the circuit design as a partition can be received. As noted, the element can be a high level element of the circuit design, i.e. one that includes one or more lower level elements, or a lower level element such as a particular instance of a primitive. It should be appreciated that one or more elements, or modules, of the circuit design can be selected for designation as a partition. In step 225, the hierarchy level of the user selected element can be identified with reference to the parsed data corresponding to the identified element.

In step 230, the selected element can be designated as a partition, for example in response to the user input. In doing so, any elements that are beneath the selected element in terms of the circuit design hierarchy can be included as part of the defined partition. In step 235, a determination can be made as to whether the newly defined partition is a child of another partition. If so, in step 240, any implementation options that have been specified for the parent of the newly created partition can be passed on automatically, or assigned, to the newly created partition through inheritance. If not, the method can proceed to step 245.

In step 245, a determination can be made as to whether any user specified implementation options have been received. If so, the method can proceed to step 250, where the user specified implementation options are updated with any user specified values. While steps 245 and 250 can be used by the user to specify any implementation options that may not have been set through inheritance, the user also can override any implementation options that were initially set via inheritance. If no user specified implementation options are received, the method can continue to step 255. In step 255, a determination can be made as to whether the user wishes to specify further partitions for the circuit design. If so, the method can proceed to step 220 to continue processing as may be required. If not, the method can end.

Inheritance, as illustrated with reference to FIG. 2, has been described in the context of creating a new partition and having that partition inherit attributes from a parent. It should be appreciated that, in one embodiment, any time an implementation option of a parent partition is modified; corresponding implementation options of any child partitions automatically can be changed to match the changed option of the parent. Such changes can be propagated down through children, grandchildren, etc. partitions via inheritance. Attributes further can be overridden for any instance in the design hierarchy. The children of such an instance would inherit the new value of the attribute, unless the attribute(s) of the children also have been overridden.

Figure 3:
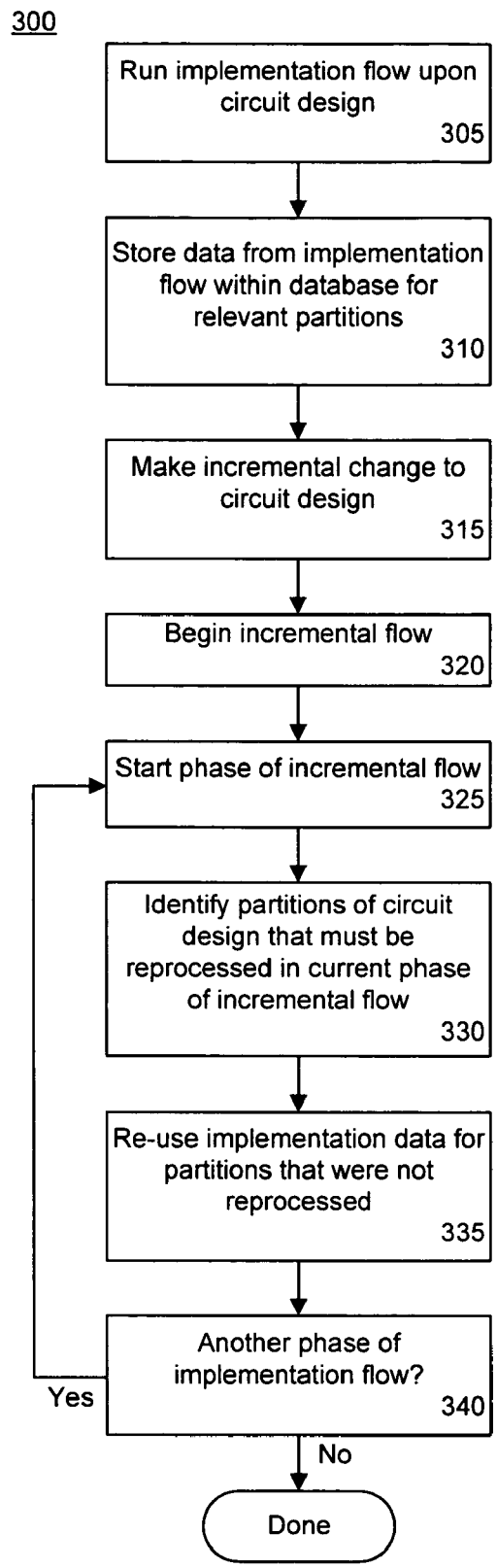
FIG. 3 is a flow chart illustrating a method of incremental flow in accordance with another embodiment of the present invention.

FIG. 3 is a flow chart illustrating a method 300 of incremental flow in accordance with another embodiment of the present invention. Method 300 can begin in a state where one or more partitions have been defined for the circuit design. In step 305, an HDL representation of the circuit design can be processed through an implementation flow. As noted, the HDL representation can be synthesized, translated, mapped, packed, placed, and routed.

In step 310, the implementation data pertaining to the various phases of the implementation flow can be stored within a database. In one embodiment, the information can be stored within the same database as the parsed information described with reference to FIGS. 1 and 2. In any case, the implementation data that pertains to, or is associated with, partitions can be associated with such partition(s) within the database. For example, implementation data generated for a particular circuit element that is included in partition A can be associated not only with the element, but also with partition A within the database.

In step 315, the circuit designer can make an incremental change to the circuit design. Examples of incremental changes can include, but are not limited to, changes to state machines, control logic, or adding registers to improve circuit design performance. In step 320, an incremental flow can be started using the modified circuit design. In one embodiment, the incremental flow can be started responsive to a single instruction or command. More particularly, a circuit designer need only instruct the EDA tool to perform an incremental flow of the design. The circuit designer need not instruct the EDA tool as to which particular portion(s) of the circuit design should be subjected to incremental flow or inform the EDA tool to perform incremental flow for each selected phase of the implementation process.

In step 325, a phase of the incremental flow, i.e. synthesis, can be started. In step 330, those partitions of the circuit design that must be re-processed during the current phase of the incremental flow can be identified. In one embodiment, any partition comprising a portion of the circuit design that has been changed can be identified. In another embodiment, the particular software tool used to perform the current implementation phase can be used to determine whether the extent of the changes made necessitate re-processing of the partition of the circuit design. In any case, the hierarchical nature of the partitions can result in a particular child partition having to be re-processed in a given phase of incremental flow, but not the parent, or parents, of the child partition due to the segmentation of the implementation data.

In step 335, any implementation data relating to the current phase for partitions that do not require re-processing can be re-used. Re-using implementation data, as described herein, eliminates the need for floorplanning of the design before performing an incremental flow. In one embodiment, as implementation data can be stored within a relational database, implementation data that is to be re-used can be copied directly from the prior implementation database into the database for the incremental flow. Implementation data for partitions that are not re-implemented in the incremental flow can be copied, or grafted, from the relational database storing prior implementation data into the data for the (new) incremental flow. Grafting the information from a prior flow can be analogized to copying and pasting one or more branches of a hierarchical tree of implementation data into the new implementation.

The correlation problem described with reference to the guide technique is avoided through the use of grafting. To graft implementation data into an incremental flow, the name of a partition must match a module instance in the design hierarchy. Though error handling is required to accommodate for cases in which the instance has been deleted or renamed, the implementation data is grafted within the database directly. This process does not entail using constraint processing as does the guide technique. In consequence, floorplanning is not needed to implement the incremental flow.

In step 340, a determination can be made as to whether additional phases of the incremental flow are to be performed. If so, the method can loop back to step 325 to begin a next phase of the incremental flow and repeat until no further phases of the incremental flow need to be performed. It should be appreciated that based upon the severity of the change to the circuit design, one or more phases of incremental flow may not have to be performed at all, and therefore can be skipped.

The embodiments described herein allow users to create partitions for a circuit design. The partitions can be organized in a hierarchical fashion. Rather than allowing re-use of implementation data for only a top level circuit design element, the embodiments described herein allow re-use of implementation data from any level of the circuit design hierarchy for which a partition has been created. The use of partitions eliminates the need for floorplanning of the circuit design prior to performing incremental flow and further supports inheritance of implementation options from one partition to another within the hierarchy.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language).

This invention can be embodied in other forms without departing from the spirit or essential attributes thereof. Accordingly, reference should be made to the following claims, rather than to the foregoing specification, as indicating the scope of the invention.

What is claimed is:

1. A method of incremental flow for a programmable logic device comprising:
    identifying elements of a hardware description language representation of a circuit design;
    specifying a hierarchy of partitions comprising selected ones of the elements;
    associating portions of implementation data from a prior implementation flow for the circuit design with corresponding partitions;
    automatically assigning at least one implementation option to a partition according to inheritance; and
    re-using selected portions of implementation data from the prior implementation flow for at least one partition during an incremental flow of the circuit design.

2. The method of claim 1, further comprising performing a plurality of phases of the incremental flow responsive to a unified instruction.

3. The method of claim 1, wherein specifying a hierarchy of partitions further comprises defining at least one partition as a child and at least one partition as a parent of the child.

4. The method of claim 3, further comprising automatically assigning an implementation option of the parent to the child.

5. The method of claim 1, wherein specifying a hierarchy of partitions further comprises defining each instance of one of the selected elements of the circuit design as a different partition.

6. The method of claim 1, wherein no floorplanning of the circuit design is required to perform the incremental flow of the circuit design.

7. A method of incremental flow for a programmable logic device comprising:
    identifying modules of a hardware description language representation of a circuit design;
    defining a partition corresponding to at least one module;
    associating implementation data from a prior implementation flow of the circuit design with the partition according to the module included within the partition;
    associating at least one implementation option with the partition;
    defining at least a second module of the circuit design as a second partition;
    specifying a parent-child relationship between the partition and the second partition, wherein the second partition is the parent and the partition is the child; and
    using the implementation data associated with the partition during at least one phase of incremental flow for the circuit design without first floorplanning the circuit design.

8. The method of claim 7, further comprising copying the implementation data associated with the partition for use during the phase of incremental flow for the circuit design.

9. The method of claim 7, further comprising automatically assigning at least one implementation option of the parent to the child through inheritance.

10. The method of claim 9, further comprising overriding at least one implementation option of the child that was initially specified through inheritance.

11. The method of claim 7, wherein defining a partition corresponding to at least one module further comprises specifying partitions for the circuit design on a per module instance basis.

12. A machine readable storage, having stored thereon a computer program having a plurality of code sections comprising:
    code for identifying elements of a hardware description language representation of a circuit design;
    code for specifying a hierarchy of partitions comprising selected ones of the elements;
    code for associating portions of implementation data from a prior implementation flow for the circuit design with corresponding partitions;
    code for automatically assigning at least one implementation option to a partition according to inheritance; and
    code for re-using selected portions of implementation data from the prior implementation flow for at least one partition during an incremental flow of the circuit design.

13. The machine readable storage of claim 12, further comprising code for performing a plurality of phases of the incremental flow responsive to a unified instruction.

14. The machine readable storage of claim 12, wherein the code for specifying a hierarchy of partitions further comprises code for defining at least one partition as a child and at least one partition as a parent of the child.

15. The machine readable storage of claim 12, wherein the code for specifying a hierarchy of partitions further comprises code for defining each instance of one of the selected elements of the circuit design as a different partition.

16. The machine readable storage of claim 12, wherein no floorplanning of the circuit design is required to perform the incremental flow of the circuit design.

* * * * *